US008346026B2

(12) United States Patent
Park et al.

(10) Patent No.: US 8,346,026 B2
(45) Date of Patent: Jan. 1, 2013

(54) PHOTOELECTRIC DEVICE USING PN DIODE AND SILICON INTEGRATED CIRCUIT (IC) INCLUDING THE PHOTOELECTRIC DEVICE

(75) Inventors: Jeong-Woo Park, Daejeon (KR); Gyungock Kim, Seoul (KR); Young-Ahn Leem, Daejeon (KR); Hyun-Soo Kim, Daejeon (KR); Bongki Mheen, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 684 days.

(21) Appl. No.: 12/517,802

(22) PCT Filed: Aug. 7, 2007

(86) PCT No.: PCT/KR2007/003791

§ 371 (c)(1), (2), (4) Date: Aug. 3, 2009

(87) PCT Pub. No.: WO2008/069400

PCT Pub. Date: Jun. 12, 2008

(65) Prior Publication Data

US 2010/0002978 A1 Jan. 7, 2010

(30) Foreign Application Priority Data

Dec. 5, 2006 (KR) ........................ 10-2006-0122568

(51) Int. Cl.
*G02F 1/035* (2006.01)
*G02B 6/12* (2006.01)
*G02B 6/00* (2006.01)

(52) U.S. Cl. .................. 385/3; 385/2; 385/14; 385/142

(58) Field of Classification Search ................ 385/2, 14, 385/39–40, 140, 3, 141–142
See application file for complete search history.

(56) References Cited

U.S. PATENT DOCUMENTS 5,991,475 A 11/1999 Nelson
7,394,948 B1 * 7/2008 Zheng et al. ...................... 385/3
2006/0008223 A1 1/2006 Gunn et al.

FOREIGN PATENT DOCUMENTS

EP 433552 A3 6/1991
JP 06-130236 A 5/1994
KR 10-2001-0024163 A 3/2001

(Continued)

OTHER PUBLICATIONS

Ansheng Liu et al., "A high-speed silicon optical modulator based on a metal-oxide-semiconductor capacitor," Nature, Feb. 12, 2004, pp. 615-618, vol. 427, Published by Nature Publishing Group.

(Continued)

*Primary Examiner* — Uyen Chau N Le
*Assistant Examiner* — Michael Mooney

(57) ABSTRACT

Provided are a photoelectric device using a PN diode and a silicon integrated circuit (IC) including the photoelectric device. The photoelectric device includes: a substrate; and an optical waveguide formed as a PN diode on the substrate, wherein a junction interface of the PN diode is formed in a direction in which light advances; and an electrode applying a reverse voltage to the PN diode, wherein N-type and P-type semiconductors of the PN diode are doped at high concentrations and the doping concentration of the N-type semiconductor is higher than or equal to that of the P-type semiconductor.

15 Claims, 3 Drawing Sheets

FOREIGN PATENT DOCUMENTS

| | | | |
|---|---|---|---|
| KR | 10-2005-0114696 | A | 12/2005 |
| KR | 10-2007-0022235 | A | 2/2007 |

OTHER PUBLICATIONS

Carlos Angulo Barrios et al., "Low-Power-Consumption Short-Length and High-Modulation-Depth Silicon Electrooptic Modulator," Journal of Lightwave Technology, Apr. 2003, pp. 1089-1098, vol. 21, No. 4, Published by IEEE.

International Search Report for PCT/KR2007/003791 filed on Aug. 7, 2007.

Written Opinion of the International Searching Authority for PCT/KR2007/003791 filed on Aug. 7, 2007.

* cited by examiner

PHOTOELECTRIC DEVICE USING PN DIODE AND SILICON INTEGRATED CIRCUIT (IC) INCLUDING THE PHOTOELECTRIC DEVICE

TECHNICAL FIELD

The present invention relates to a silicon semiconductor-based optical communication device, and more particularly, to a silicon-based compact and low power photoelectric device and a silicon integrated circuit (IC) including the same.

BACKGROUND ART

Speeds of central processing units (CPUs), dynamic random access memories (DRAMs), static random access memories (SRAMs), etc. have increased with the development of silicon semiconductor technology. However, while semiconductor chip operating speeds have increased, communication speeds between semiconductor chips have remained stagnant. A method of performing communication between chips using light has been suggested to solve this problem.

Methods of connecting chips using photoelectric devices using compound semiconductors have been studied in all the world. However, compound semiconductor photoelectric devices are expensive, and use advanced package technology. There are methods of integrating silicon photoelectric devices into silicon semiconductor chips to ease fabrication and reduce cost. An optical modulator will be described as an example of such a silicon photoelectric device.

There are several types of silicon optical modulator. The first uses resonance and/or anti-resonance of a Fabry-Perot Cavity. This is described in detail in Journal of Lightwave Technology, Vol. 21, No. 4, pp. 1089-1098, 2003, 'Low-Power Consumption Short-Length and High-Modulation-Depth Silicon Electrooptic Modulator.' In this type, the amount of light passing the Fabry-Perot Cavity is adjusted according to a current applied to a material between two mirrors of the Fabry-Perot Cavity, e.g. silicon. However, the characteristics of the Fabry-Perot Cavity change with temperature.

A silicon semiconductor chip must normally operate over a range of about 100° C., and thus any integrated silicon photoelectric device must match this. However, since the refractive index of silicon changes with temperature, the amount of light passing the Fabry-Perot Cavity varies. In other words, in the Fabry-Perot Cavity, the currents corresponding to resonance and anti-resonance are valid only at a specific temperature. Thus, the chip temperature must be sensed to vary the currents with the temperature so as to apply accurate resonance and anti-resonance currents. A method of using a Mach-Zehnder interferometer is employed to solve this temperature problem.

FIG. 1 is a schematic view of a Mach-Zehnder optical modulator. Referring to FIG. 1, the Mach-Zehnder optical modulator includes an input optical waveguide 1, an output waveguide 2, and two branches 3 and 4 connected between the input and output optical waveguides 1 and 2. The operation of the Mach-Zehnder optical modulator will now be briefly described. Light is input to the input optical waveguide 1 and split into two light portions at a first branch point 5. The two light portions pass through the two branches 3 and 4 and then are combined at a second branch point 6. The combined light is output to the output waveguide 2. If any variation is not applied to the two branches 3 and 4, constructive interference occurs due to the combination of the two light portions at the second branch point 6. Thus, the intensity of the original light is maintained. However, if a current or a voltage is applied to the branch 3 to change the refractive indexes of an optical waveguide, a phase difference occurs between the two light portions. Thus, when the two light portions are combined at the second branch point 6, destructive interference may occur. As a result, constructive or destructive interference may occur depending on whether an electrical signal is applied to a branch. This allows light to be modulated.

Since the refractive indexes of the two branches vary with temperature in this method, light portions passing the two branches undergo the same phase shift with the change of the temperature. Thus, a phase difference can occur between the two light portions only if an electric signal is applied to one of the two branches. As a result, the state of constructive or deconstructive interference is not dependant on the temperature.

The most advanced characteristic of such a Mach-Zehnder silicon optical modulator is described in Optics Express, vol. 13, No. 8, pp. 3129-3135 , 2005, 'High Speed Silicon Mach-Zehnder Modulator' and Nature, Vol. 427, No. 12, pp. 615-618, 2004, 'A High Speed Silicon Modulator based on Metal-Oxide-Semiconductor Capacitor.' Two arms of a Mach-Zehnder interferometer constitute a metal-oxide-semiconductor (MOS) structure in this method. The MOS structure uses a method of applying a voltage to accumulate charges on both sides of an oxide layer and vary the refractive index of silicon using the accumulated charges. Here, the refractive index Δn is varied as in Equation 1 when an input wavelength is 1.55 μm.

$$\Delta n=-[8.8\times10^{-22}\times\Delta N+8.5\times10^{-18}\times(\Delta P)^{0.8}] \quad (1)$$

Wherein ΔN and ΔP respectively denote variations of concentrations of electrons and holes. As shown in Equation 1, the variation of the refractive index is greater when the variation of the concentrations of electrons and holes are great. However, since the variation of refractive index caused by an applied current in silicon is smaller than that of a compound semiconductor, the variation of the applied current must be great. The area in which the concentrations of electrons and holes vary should be wide. A confinement factor Γ should be great to increase the variation of refractive index. The confinement factor Γ is defined as the intensity of light passing a portion in which a refractive index varies with respect to an entire intensity of light.

A variation of a substantial effective refractive index is '$\Delta n_{eff}=\Gamma\times\Delta n$.' However, the confinement factor Γ is small in the MOS structure. As a result, the variation of the effective refractive index is small. This makes it difficult to constitute an effective Mach-Zehnder optical modulator.

This will be described in more detail. If a voltage is applied to the MOS structure, charges are generated as in Equation 2:

$$\Delta N=\Delta P=\epsilon_0\times\epsilon_r\times(V-V_{FB})/(t_{ox}\times t) \quad (2)$$

wherein $\epsilon_0$ denotes the permittivity of a vacuum, $\epsilon_r$ denotes the dielectric constant of a gate oxide, $V_{FB}$ denotes a flat band voltage of the MOS structure, $t_{ox}$ denotes the thickness of the gate oxide, and t denotes the thickness of a portion in which charges are gathered. Typically, $t_{ox}$ is about 5 nm, and t is 10 nm. If constants of materials and these figures are substituted for Equation 2, the amount of charges is '$\Delta N=\Delta P=\sim4\times10^{18}\times(V-V_{FB})cm^{-3}$.' Here, since '$(V-V_{FB})$' is about 2 V, 'ΔN=ΔP' is about $10^{19}$ $cm^{-3}$. However, since the confinement factor r is only several percent, the effective refractive index variation $\Delta n_{eff}$ is not great. Thus, it is difficult to effectively vary the refractive index due to a small confinement factor in a MOS structure. As a result, it is difficult to greatly vary the phase of light. Therefore, the arms of a Mach-Zehnder modulator become long. The length of each arm of a Mach-Zehnder modulator is several millimeters in the above-mentioned paper. The long length of the arm additionally increases capacitance and thus makes high-speed modulation difficult. Also, a gate part is generally formed of polysilicon in the MOS structure. The polysilicon well absorbs light and thus reduces efficiency.

There is a method of injecting a current using a p-i-n structure, besides a MOS structure. This method is disclosed in detail in U.S. Pat. No. 5,908,305. When this method is used for silicon, modulation speed is limited. After a current is injected into the p-i-n structure, injected charges recombine and thus disappear. Here, the average time required for recombining the injected charges is very long in the case of silicon. Thus, a long time is required to return to their original states. This limits the modulation speed.

There has been suggested a method of operating a part of which phase shifts in a PN reverse bias mode to solve the problems of the MOS structure or the p-i-n structure. An example of this method is disclosed in U.S. Pat. No. 2006/0008223 A1. In this patent, a silicon lateral PN diode is formed in a rib optical waveguide to operate in a PN reverse bias mode so as to constitute a Mach-Zehnder optical modulator. However, Improvement of confinement factor and optimization of doping concentration need.

DISCLOSURE OF INVENTION

Technical Problem

The present invention provides a compact, lower power photoelectric device operating at a high speed to effectively transmit a multi-channel signal between semiconductor chips, and a silicon integrated circuit (IC) including the photoelectric device.

Technical Solution

According to an aspect of the present invention, there is provided a photoelectric device including: a substrate; an optical waveguide formed as a PN diode on the substrate, wherein a junction interface of the PN diode is formed in a direction in which light advances; and an electrode applying a reverse voltage to the PN diode, wherein N-type and P-type semiconductors of the PN diode are doped at high concentrations and the doping concentration of the N-type semiconductor is higher than or equal to that of the P-type semiconductor.

Each of the doping concentrations of the N-type and P-type semiconductors may be greater than or equal to $5\times10^{17}$ $cm^{-3}$. The doping concentration of the N-type semiconductor may be $10^{20}$ $cm^{-3}$, and the doping concentration of the P-type semiconductor may be $10^{19}$ $cm^{-3}$.

The photoelectric device may be a Mach-Zehnder optical modulator, wherein a forward DC (direct current) voltage is applied to one arm of the Mach-Zehnder optical modulator, and a signal modulating reverse voltage is applied to another arm of the Mach-Zehnder optical modulator. The forward DC voltage may be equal to or less than a built-in voltage of the PN diode.

The reverse voltage applied by the electrode may be modulated to vary a characteristic of light passing through the optical waveguide. The characteristic of the light may be a confinement factor, a phase, an absorption rate, or an intensity of light. The reverse voltage may be modulated to vary an effective refractive index of the optical waveguide, the absorption rate of the light, or the intensity of the light.

The substrate may be a silicon on insulator (SOI) to form the optical waveguide. The substrate may be a silicon bulk substrate to form the optical waveguide, wherein an oxide is selectively injected into a portion of the silicon bulk substrate which is to be the optical waveguide.

According to another aspect of the present invention, there is provided a silicon IC formed by integrating the photoelectric device with at least one of an electronic device and an optical device on a substrate The electronic device may include at least one of a complementary metal-oxide-semiconductor (CMOS), a bipolar transistor, a P-I-N, and a diode. The optical device may be a multiplexer or a photodiode (PD).

The photoelectric device of the present invention can use a vertical PN diode. Also, doping concentrations of P-type and N-type semiconductors of the PN diode can be appropriately adjusted to realize the photoelectric device having a small size and operating at a low power and a high speed, e.g. an optical modulator.

Advantageous Effects

A reverse bias can be applied to a photoelectric device using a PN diode structure according to the present invention to vary the thickness of a depletion region. Also, doping concentrations of P-type and N-type semiconductors of the PN diode can be appropriately adjusted, e.g. the P-type and N-type semiconductors can be doped at high concentrations but the doping concentration of the P-type semiconductor can be lower than the doping concentration of the N-type semiconductor. As a result, a photoelectric device having a small size and operating at a low power and a high speed, e.g. an optical modulator, can be realized.

Also, the photoelectric device can be integrated with an electronic device or an optical device on the same substrate to realize a silicon IC having a small size and operating at a low power and a high speed.

DESCRIPTION OF DRAWINGS

The above and other features and advantages of the present invention will become more apparent by describing in detail exemplary embodiments thereof with reference to the attached drawings in which.

BEST MODE

Figure 1:
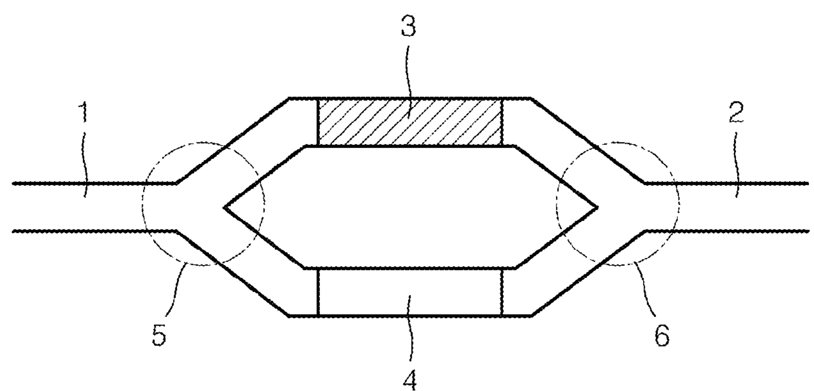
FIG. 1 is a schematic view of a Mach-Zehnder optical modulator.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being bn' another layer or substrate, it can be directly on the other layer or substrate, or intervening layers may also be present. Like reference numerals denote like elements in the drawings, and thus their description will be omitted.

Figure 2:
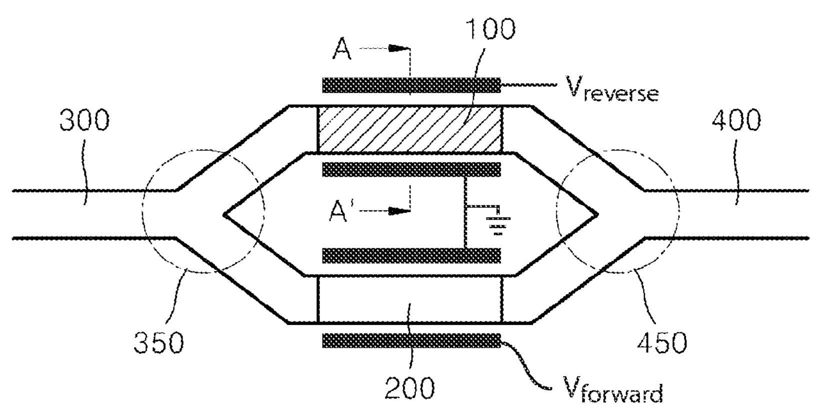
FIG. 2 is a schematic view of a Mach-Zehnder optical modulator using a vertical PN diode according to an embodiment of the present invention.

FIG. 2 is a schematic view of a Mach-Zehnder optical modulator using a vertical PN diode according to an embodiment of the present invention. Here, the Mach-Zehnder optical modulator of the present embodiment has a similar structure to a conventional Mach-Zehnder optical modulator. The Mach-Zehnder optical modulator includes input and output optical waveguides 300 and 400 and first and second branches 100 and 200. Light is branched at a first branch point 350 of the input optical waveguide 300 and then combined at a second branch point 450 of the output optical waveguide 400. However, in the Mach-Zehnder optical modulator of the present embodiment, an optical waveguide of the first branch 100 for modulation has a different structure and is formed of a different material from the conventional branch. The optical waveguide of the first branch 100 will now be described in more detail with reference to FIG. 3.

Figure 3:
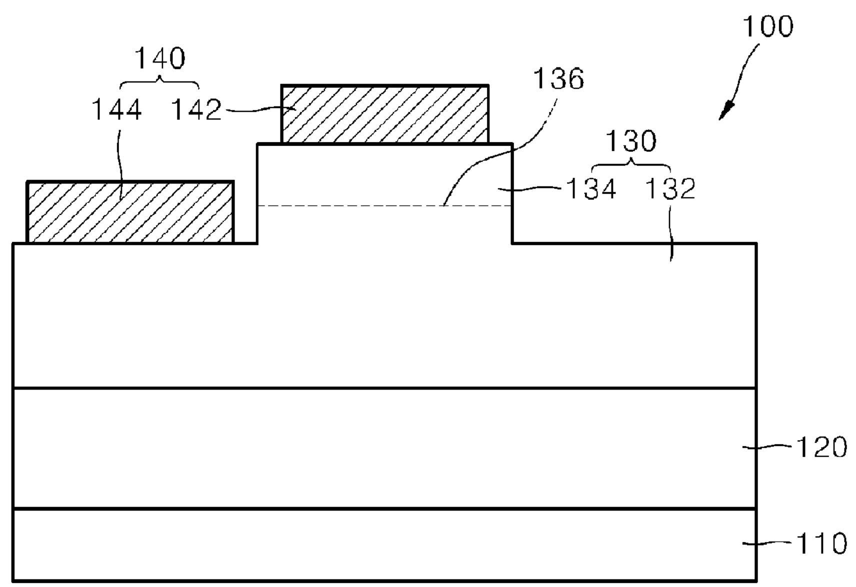
FIG. 3 is a cross-sectional view taken along line A-A' of FIG. 2.

FIG. 3 is a cross-sectional view taken along a line A-A' of FIG. 2, showing the cross-section of the first branch 100 for modulating an optical signal.

Referring to FIG. 3, the first branch 100 includes a substrate 110, a cladding 120 formed on the substrate 110, an optical waveguide 130 formed of a PN diode, and an electrode 140 for applying a current or voltage to the PN diode.

The substrate 110 may be a silicon on insulator (SOI) substrate or a silicon bulk substrate. If the substrate 110 is the silicon bulk substrate, an oxide is selectively injected into a portion in which an optical waveguide is to be formed.

The optical waveguide 130 is formed in a vertical PN diode structure in which a junction plane 136 is parallel with substrate plane. Here, in the PN diode, an upper layer 134 may be a P type and a lower layer 132 may be an N type. However, the opposite is also possible. The electrode 140 includes a first electrode 142 formed on the upper layer 134 and a second electrode 144 formed on the lower layer 132 to apply a reverse voltage to the PN diode. The optical characteristics are varied by applying the reverse voltage, to modulate an optical signal. The characteristic which is varied may be an optical confinement factor, a phase of light, an absorption rate of light, an intensity of light, etc.

The variation of carrier concentration as shown in Equation 1 is the most effective phenomenon for a silicon optical modulator. A method of varying the concentration of the carriers includes MOS, p-i-n forward, and PN reverse methods as previously mentioned. If a current or voltage is applied to an optical waveguide, the concentration of carriers in all or part of the optical waveguide is varied. The variation of the concentration of carriers varies the refractive index as in Equation 1 above. The variation of the refractive index shifts the phase of light, and an optical modulator is realized using the phase shift.

The PN reverse method applied to the present embodiment is to vary a reverse bias in a PN diode so as to change the thickness of a depletion region. In other words, the PN reverse method is to shift the phase of light according to the depletion of carriers. The phase shift must be great to allow the optical modulator to be small.

Optimal conditions of the PN reverse method to allow a large phase shift in the Mach-Zehnder optical modulator of the present embodiment will now be described.

If a reverse bias is applied to the PN diode, the thickness Wn of an N type depletion region and the thickness Wp of a P type depletion region are expressed respectively in Equations 3 and 4:

$$Wn(Nd, Na) = \sqrt{\frac{2\cdot\varepsilon\cdot(V_{built-in}+V_{reverse})\cdot Na}{q\cdot Nd\cdot(Na+Nd)}} \tag{3}$$

$$Wp(Nd, Na) = \sqrt{\frac{2\cdot\varepsilon\cdot(V_{built-in}+V_{reverse})\cdot Nd}{q\cdot Na\cdot(Nd+Na)}} \tag{4}$$

wherein ∈ denotes the permittivity of silicon, $V_{built-in}$ denotes a built-in voltage of a PN junction, $V_{reverse}$ denotes an applied reverse voltage, Na denotes the concentration of P-type acceptors, Nd denotes the concentration of N type donor, and q denotes a charge quantity of electrons.

If a direct current (DC) forward voltage equal to the voltage $V_{built-in}$, is applied to the second branch 200 of the Mach-Zehnder optical modulator of FIG. 2, and a reverse voltage $V_{reverse}$ is applied to the first branch 100, the difference between the effective refractive indexes of the two branches is given by Equation 5. The forward voltage applied to the second branch 200 may be smaller than the voltage $V_{built-in}$ in consideration of capacitance.

$$\Delta n_{eff}=-[8.8\times10^{-22}\times Wn(Nd,Na)\times Nd\times\Gamma+8.5\times10^{-18}\times (Na)^{0.8}\times Wp(Nd,Na)\times\Gamma] \tag{5}$$

wherein Γ denotes the amount of light confined to the unit width of a depletion region.

As shown in Equation 5, a variation $\Delta n_{eff}$ of an effective refractive index is a function of a doping concentration.

Figure 4:
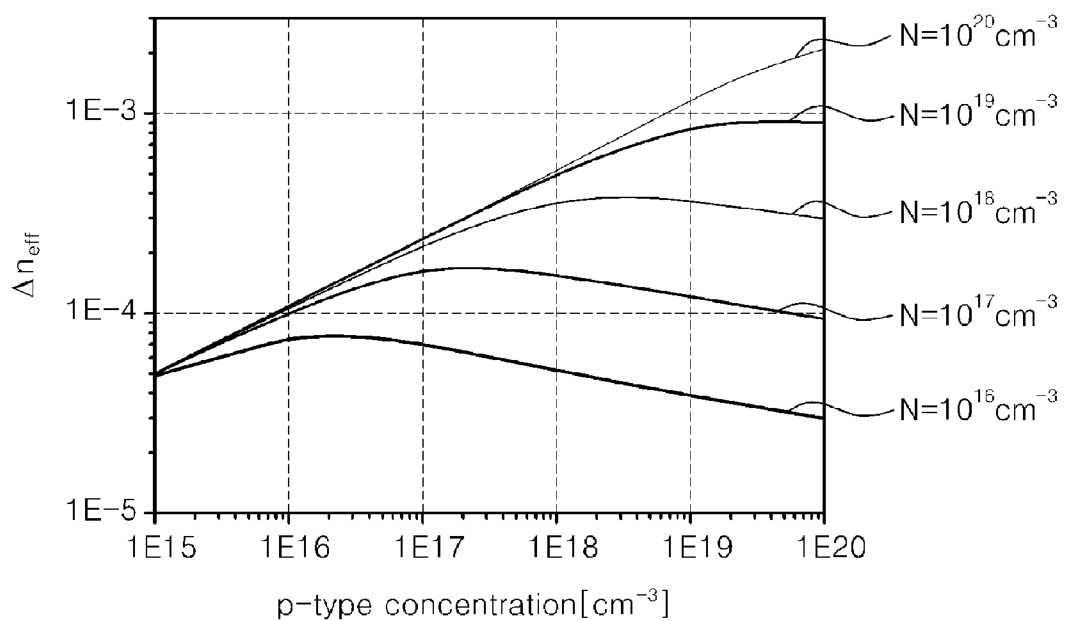
FIG. 4 is a graph illustrating variations of an effective refractive index with respect to a doping density of an optical waveguide using a vertical PN diode.

FIG. 4 is a graph illustrating a variation of an effective refractive index with respect to a doping concentration of an optical waveguide using a vertical PN diode. Referring to FIG. 4, when doping concentrations of P-type and N-type semiconductors are high, the variation of the effective refractive index is increased.

Figure 5:
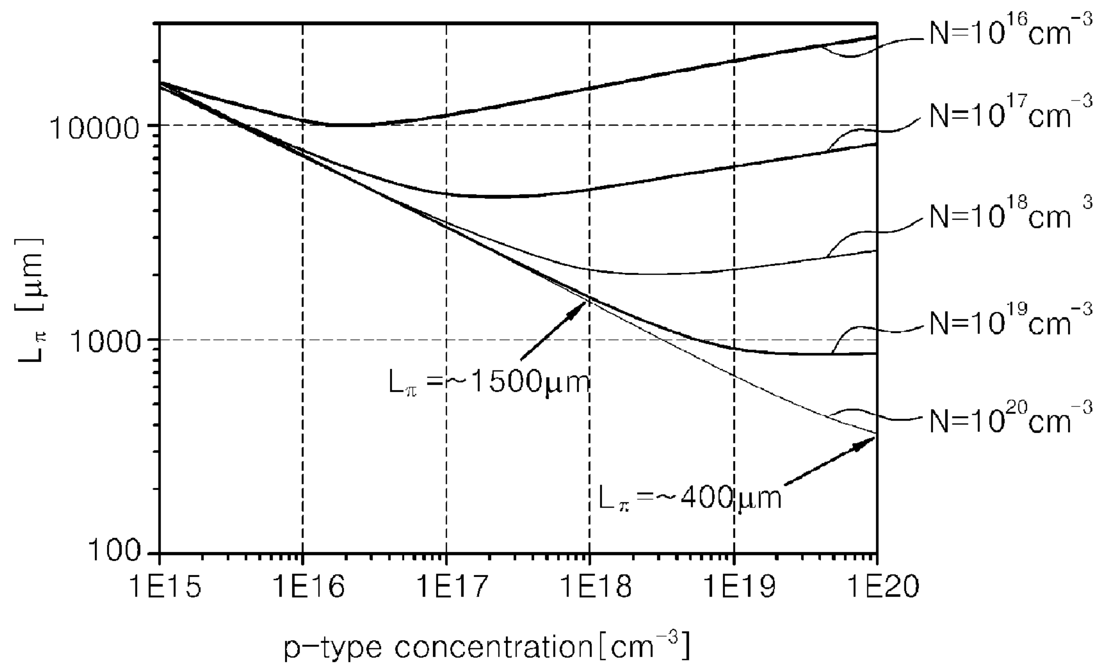
FIG. 5 is a graph illustrating a length $L_\pi$ shifting a phase $\pi$ of light with respect to a doping concentration of the optical waveguide using a vertical PN diode.

FIG. 5 is a graph illustrating a variation of a length $L_\pi$ with respect to a doping concentration of an optical waveguide using a vertical PN diode. The length $L_\pi$ denotes the length of the optical waveguide in which the phase of light is varied by π.

The length $L_\pi$ of the optical waveguide in a Mach-Zehnder optical modulator is given by Equation 6:

$$L_\pi=\lambda/2\Delta n_{eff} \tag{6}$$

wherein λ denotes an operation wavelength.

As shown in Equation 6, the length $L_\pi$ is decreased with an increase of the effective refractive index.

Referring to FIG. 4, the effective refractive index varies greatly with an increase of the doping concentration. As a result, a small optical modulator can be fabricated with a high doping concentration.

FIG. 5 is a graph illustrating the length $L_\pi$ depending on a doping concentration. When the doping concentrations of P-type and N-type semiconductors are high, the length $L_\pi$ is reduced. If the P-type and N-type semiconductors are doped to high concentrations of about $10^{20}$ $cm^{-3}$, the length L is reduced to about 400 μm.

Operation speed is an important factor of an optical modulator. The operation speed of an optical modulator in a PN inverse mode depends on a depletion capacitance. Thus, the operation speed of the optical modulator is increased by a small depletion capacitance. The depletion capacitance $C_{perarea}$ per unit area is given by Equation 7:

$$C_{per\ area} = \frac{\varepsilon}{Wp + Wn} \tag{7}$$

Equation 7 is multiplied by a diode area $L_\pi \times W$ to calculate the total depletion capacitance, which is expressed by Equation 8. Here, W denotes the width of a PN diode, i.e. a length of the interface 136 of FIG. 3 marked with a dotted line. V2, V1 is upper and lower limit of voltage swing for operation of modulator.

$$C_{total}(V) = \frac{q \cdot \lambda \cdot W}{4} \cdot \frac{1}{(8.8 \times 10^{-22} + 8.5 \times 10^{-8} \cdot p^{-0.2}) \cdot \frac{d\Gamma}{dt_{dep}} \cdot} \sqrt{V_{built-in} + V} \cdot \left( \frac{\sqrt{V_{built-in} + V_2} -}{\sqrt{V_{built-in} + V_1}} \right) \tag{8}$$

Figure 6:
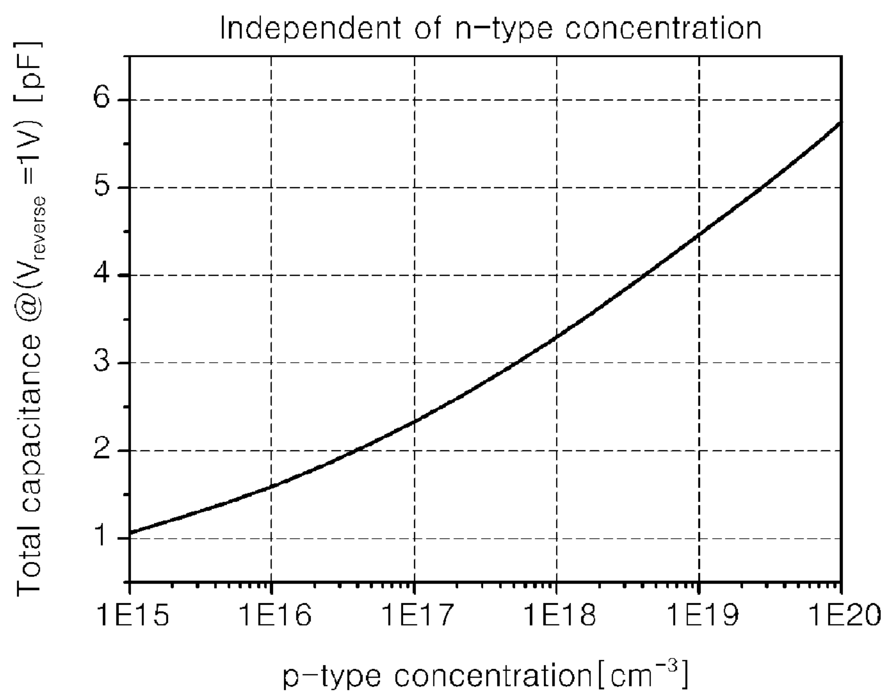
FIG. 6 is a graph illustrating a total depletion capacitance with respect to a doping concentration of an optical waveguide using a vertical PN diode.

FIG. 6 is a graph of Equation 8, illustrating the total depletion capacitance with respect to the doping concentration of an optical waveguide using a vertical PN diode.

As shown in FIG. 6, an optical modulator having a low capacitance can be realized with a low concentration of P-type acceptors. However, if the concentration of the acceptors is low, the length $L_\pi$ becomes long. Thus, a small optical modulator cannot be realized.

The theory described above will now be integrated. A small optical modulator can be realized with high concentrations of N-type and P-type semiconductors. The operation speed of the optical modulator is increased with a low concentration of P-type semiconductors. Therefore, the doping concentration of the N-type semiconductor may be maximized, and the doping concentration of the P-type semiconductor may be lower than the doping concentration of the N-type semiconductor. For example, each of the doping concentrations of the N-type and P-type semiconductors may be greater than or equal to $5 \times 10^{17}$ $cm^{-3}$. The doping concentration of the N-type semiconductor may be $10^{20} cm^{-3}$, and the doping concentration of the P-type semiconductor may be $10^{19}$ $cm^{-3}$.

A doping concentration can be appropriately adjusted to minimize the size of an optical modulator having a PN diode structure of the present invention and operate the optical modulator at low power and high speed.

A Mach-Zehnder optical modulator has been described as an example. A method of applying a reverse voltage to a vertical PN diode according to the present invention can be applied to an optical modulator and various types of photo-electrical devices. Photoelectric devices using such PN diode structures can be integrated with electronic devices or optical devices on the same silicon substrate to manufacture compact integrated circuits (ICs).

For example, an electronic device such as a CMOS, bipolar transistor, P-I-N, or diode can be integrated with the optical modulator on a silicon substrate. An optical device such as a multiplexer or a photodiode (PD) can be integrated with the optical modulator on a silicon substrate. Alternatively, such an electronic device and photo device can be integrated with a photoelectric device of the present invention on a silicon substrate. A silicon IC integrated on a silicon substrate can have a small size and operate at a low power and a high speed due to the photoelectric device of the present invention having a small size and operating at a low power and high speed.

While the present invention has been particularly shown and described with reference to exemplary embodiments thereof, it will be understood by those of ordinary skill in the art that various changes in form and detail may be made therein without departing from the spirit and scope of the present invention as defined by the following claims.

INDUSTRIAL APPLICABILITY

The present invention relates to a silicon semiconductor-based optical communication device, and more particularly, to a silicon-based compact and low power photoelectric device and a silicon integrated circuit (IC) including the same. A reverse bias can be applied to a photoelectric device using a PN diode structure according to the present invention to vary the thickness of a depletion region. Also, doping concentrations of P-type and N-type semiconductors of the PN diode can be appropriately adjusted, e.g. the P-type and N-type semiconductors can be doped at high concentrations but the doping concentration of the P-type semiconductor can be lower than the doping concentration of the N-type semiconductor. As a result, a photoelectric device having a small size and operating at a low power and a high speed, e.g. an optical modulator, can be realized.

The invention claimed is:

1. A photoelectric device comprising:
a substrate;
an optical waveguide formed as a PN diode on the substrate, the PN diode comprising an N-type region and a P-type region forming a junction plane therebetween. wherein the junction plane is parallel with a substrate plane; and
an electrode configured to apply a reverse voltage to the PN diode,
wherein a doping concentration for the N-type region is at least $10^{19}$ $cm^{-3}$, and a doping concentration for the P-type region is at least $10^{19}$ $cm^{-3}$, and
wherein the photoelectric device is a Mach-Zehnder optical modulator.

2. The photoelectric device of claim 1, wherein the doping concentration of the N-type region is $10^{20}$ $cm^{-3}$.

3. The photoelectric device of claim 2, wherein the doping concentration of the P-type region is $10^{19} cm^{-3}$.

4. The photoelectric device of claim 1, wherein a forward DC (direct current) voltage is applied to a first arm of the Mach-Zehnder optical modulator, and a signal modulating reverse voltage is applied to a second arm of the Mach-Zehnder optical modulator.

5. The photoelectric device of claim 4, wherein the forward DC voltage is equal to or less than a built-in voltage of the PN diode.

6. The photoelectric device of claim 1, wherein the reverse voltage applied by the electrode is modulated to vary a characteristic of light passing through the optical waveguide.

7. The photoelectric device of claim 6, wherein the characteristic of light is one of a confinement factor, a phase, an absorption rate, and an intensity of light.

8. The photoelectric device of claim 6, wherein the reverse voltage is modulated to vary at least one of an effective refractive index of the optical waveguide, an absorption rate of light, and an intensity of light.

9. The photoelectric device of claim 1, wherein the substrate is an SOI (silicon on insulator).

10. The photoelectric device of claim 1, wherein the substrate is a silicon bulk substrate, and wherein an oxide is selectively injected into a portion of the silicon bulk substrate which is to be the optical waveguide.

11. A silicon IC (integrated circuit) formed by integrating the photoelectric device of claim 1 with at least one of an electronic device and an optical device on a substrate.

12. The silicon IC of claim 11, wherein the electronic device comprises at least one of a CMOS (complementary metal-oxide-semiconductor), a bipolar transistor, a P-I-N, and a diode.

13. The silicon IC of claim 11, wherein the optical device is at least one of a multiplexer and a (PD) photodiode.

14. The photoelectric device of claim 1, wherein an upper layer of the photoelectric device includes the N-type region and a lower portion of the photoelectric device includes the P-type region.

15. The photoelectric device of claim 1, wherein the lower portion includes the N-type region and the upper portion includes the P-type region.

* * * * *